United States Patent
Eckardt

(10) Patent No.: US 11,257,859 B2
(45) Date of Patent: Feb. 22, 2022

(54) TDI LINE DETECTOR

(71) Applicant: Deutsches Zentrum für Luft- und Raumfahrt e.V., Cologne (DE)

(72) Inventor: Andreas Eckardt, Berlin (DE)

(73) Assignee: Deutsches Zentrum für Luft- und Raumfahrt e.V., Cologne (DE)

( * ) Notice: Subject to any disclaimer, the term of this patent is extended or adjusted under 35 U.S.C. 154(b) by 0 days.

(21) Appl. No.: 16/612,431

(22) PCT Filed: May 9, 2018

(86) PCT No.: PCT/EP2018/062095
§ 371 (c)(1),
(2) Date: Nov. 11, 2019

(87) PCT Pub. No.: WO2018/206694
PCT Pub. Date: Nov. 15, 2018

(65) Prior Publication Data
US 2020/0066785 A1 Feb. 27, 2020

(30) Foreign Application Priority Data
May 12, 2017 (DE) .................... 10 2017 208 041.8

(51) Int. Cl.
*H01L 27/148* (2006.01)
*H04N 5/372* (2011.01)

(52) U.S. Cl.
CPC ... *H01L 27/14856* (2013.01); *H04N 5/37213* (2013.01)

(58) Field of Classification Search
CPC .............. H01L 27/14856; H04N 5/37213
See application file for complete search history.

(56) References Cited

U.S. PATENT DOCUMENTS 5,258,621 A    11/1993   Noble
5,784,101 A     7/1998   Hasegawa et al.
(Continued)

FOREIGN PATENT DOCUMENTS

DE        69509272 T2    2/1995
DE    102006057726 B4   12/2008
(Continued)

OTHER PUBLICATIONS

Eckardt A; "Time delay-integration line detector for use in earth observance field, has selection register unit designed as shifting register, masking provided between pixels of lines, and registers of pixels widened corresponding to width of masking"; Aug. 27, 2009; English Translation; pp. 1-4 (Year: 2009).*
(Continued)

*Primary Examiner* — Cynthia Segura
(74) *Attorney, Agent, or Firm* — Bonini IP Law, LLC; Frank J. Bonini, Jr.

(57) ABSTRACT

The invention relates to a TDI line detector (1), comprising n TDI lines (Z1-Zn), wherein each TDI line (Z) has m pixels (P), and at least one read-out electronics (11-14), wherein the TDI line detector (1) is subdivided into x submodules (S1-S4), wherein the number of lines (Z) of a submodule (S1-S4) is n/x, wherein a discrete read-out electronics (11-14) is associated with the last line of each submodule (S1-S4), wherein the length (L1) of the read-out electronics (11-14) corresponds to an integer multiple of the length (L2) of a pixel (P), wherein x≥2 is, wherein the associated pixels (P) of different submodules (S1-S4) are arranged pixel to pixel relative to one another or the submodules (S1-S4) or groups of submodules (S1-S4) are laterally interlinked alternately by half a pixel (P).

8 Claims, 2 Drawing Sheets

(56) References Cited

U.S. PATENT DOCUMENTS

| | | | | |
|---|---|---|---|---|
| 5,917,620 | A * | 6/1999 | Hasegawa | H04N 9/045 358/513 |
| 7,235,773 | B1 | 6/2007 | Newman | |
| 8,368,774 | B2 | 2/2013 | Grycewicz | |
| 9,374,540 | B1 | 6/2016 | Sacco et al. | |
| 9,534,893 | B2 | 1/2017 | Tulet et al. | |
| 2003/0193589 | A1* | 10/2003 | Lareau | H04N 3/1525 348/294 |
| 2011/0279725 | A1* | 11/2011 | Cazaux | H04N 5/3743 348/308 |
| 2012/0127331 | A1* | 5/2012 | Grycewicz | H04N 5/349 348/222.1 |
| 2013/0057931 | A1 | 3/2013 | Mayer et al. | |
| 2013/0258153 | A1* | 10/2013 | Fowler | H04N 5/37206 348/308 |
| 2013/0286266 | A1* | 10/2013 | Cazaux | H01L 27/14603 348/295 |
| 2019/0288028 | A1* | 9/2019 | Lai | H04B 3/32 |

FOREIGN PATENT DOCUMENTS

| | | | |
|---|---|---|---|
| DE | 102008024417 B3 * | 8/2009 | H04N 5/37206 |
| DE | 102008024417 B3 | 8/2009 | |
| DE | 102014218243 A1 | 9/2014 | |
| JP | 2011146924 A * | 7/2011 | H04N 5/335 |
| JP | 2011146924 A | 7/2011 | |
| WO | 2005084327 A2 | 9/2005 | |
| WO | 2009026522 A1 | 2/2009 | |
| WO | 2012148919 A2 | 11/2012 | |

OTHER PUBLICATIONS

Nakanishi; "Image Sensor and Imaging Apparatus Employing the Same"; Jul. 28, 2011; English Translation; pp. 1-6 (Year: 2011).*

Nakanishi Junji; Image Sensor and Imaging Apparatus Employing the Same; Jul. 2011; Mitsubishi Electric Corp; pp. 1-11; English Translation (Year: 2011).*

Agwani, Suhail; Miller, James; Chamberlain, Sawas G.; Washkurak, William D., "High Resolution Tri-Linear Coulour TDI CCD Image Sensor With Programmable Responsivity Gain", International Electron Devices Meeting, EDM '95, Washington DC, Dec. 10-13, 1995, pp. 7.1.1-7.1.4, 151-154.

Hsieh, T.C.; McGrath, R.D.; Metz, W. A.; and Boyd, S. D.; "Linear Image Sensor Optimized for Fast Color Scanning," IEEE Transactions on Consumer Electronics, vol. 38, No. 3, pp. 576-582, Aug. 1992.

* cited by examiner

TDI LINE DETECTOR

BACKGROUND OF THE INVENTION

1. Field of the Invention

The invention relates to a TDI line detector.

Particularly in the field of earth observation, various methods and sensors are known that scan the earth from orbit with the aid of various sensors (lines or matrixes). Using various technologies, the aim is to maximize the resolution of the instrument both spectrally and geometrically. Examples of such technologies are sensor architectures with TDI line detectors or movement-compensated matrix detectors and/or line detectors.

2. Brief Description of the Related Art

DE 10 2008 024 417 B3 has disclosed a TDI line detector comprising n TDI lines, each TDI line having m pixels. In this case, at least one outer line is associated with a readout register unit, each pixel of the first and/or nth line being associated with a separate register. In it, a masking is provided between two pixels of each line, the masking having a width of one pixel or an integral multiple of one pixel and the registers of the pixels being widened in accordance with the width of the maskings. In addition, a detector device is disclosed, which has at least two TDI line detectors, the respective TDI line detectors being positioned offset from each other by one pixel width in the transverse direction and being positioned offset from each other by an integral multiple of one pixel length in the longitudinal direction. The TDI line detectors in this case are preferably synchronized with each other and the detector device can also be of a monolithic design.

One problem in TDI line detectors with multiple TDI stages is the stability in order to limit the jitter between the pixels to less than ⅓ of a pixel during recording. For example if 1,000 lines are clocked with a clock frequency of 10 kHz, then the line detector must be kept stable for 100 ms in order to comply with the jitter requirements. This particularly limits the desire for an increase in the number of lines. But even with the conventional number of lines, this requires an increased complexity, for example because of so-called microvibrations in a satellite.

SUMMARY OF THE INVENTION

The TDI line detector comprises n TDI lines, each TDI line having m pixels. In this case, the TDI line detector is divided into x submodules, the number of lines of a submodule being n/x. In addition, each last line of each respective submodule is associated with a separate set of readout electronics, the length of the readout electronics corresponding to an integral multiple of the length of a pixel, where x≥2. In this case, the associated pixels of different submodules are positioned relative to one another with pixel-level accuracy. This achieves the fact that the time during which the TDI line detector has to be kept stable is reduced by the factor x with the same number of lines. In this connection, it should be noted that the n TDI lines are activated synchronously and the TDI line detector is preferably embodied as a monolithic chip, more preferably using CMOS technology.

The data that are then read out are transmitted via a bus system to an evaluation unit where they are correlated with one another by means of known methods. One possible method, for example, is the center-of-gravity method.

Alternatively, every second submodule or alternating groups of submodules is/are positioned laterally offset by a half-pixel, which makes it possible to increase the geometrical resolution. In this embodiment as well, the stability problem is reduced by the factor x.

In another embodiment, 10≤x≤100. This strikes a very good compromise between mitigation of the stability problem and the additional expense for the readout electronics and postprocessing.

In another embodiment, at least some of the submodules have filters for various spectral ranges so that a multispectral sensor can be achieved. This can be combined with panchromatic submodules. In such an embodiment, it is for example provided that if three different spectral ranges are being mapped, then three submodules form a group, i.e. the first three submodules are positioned in a line and the next three submodules are positioned offset laterally by a half-pixel. With the additional integration of a panchromatic submodule, the group would then consist of four submodules.

In another embodiment, the pixel sizes are the same for all lines. Particularly in mixed embodiments in which panchromatic and spectral submodules are mixed, this avoids aliasing effects. The spectral pixels can then be combined in the evaluation unit for example through the formation of macropixels in order to achieve an improved signal-to-noise ratio.

In another embodiment, the pixels are rectangular, with the pixels being twice as wide as they are long. Particularly in the embodiment in which individual submodules are positioned laterally offset by a half-pixel in order to increase the geometrical resolution, this therefore yields square pixels again in the postprocessing.

A preferred application field of the TDI sensor is the use in a satellite.

BRIEF DESCRIPTION OF THE DRAWING FIGURES

The invention will be explained in greater detail below based on preferred exemplary embodiments. In the figures.

DETAILED DESCRIPTION OF THE INVENTION

Figure 1:
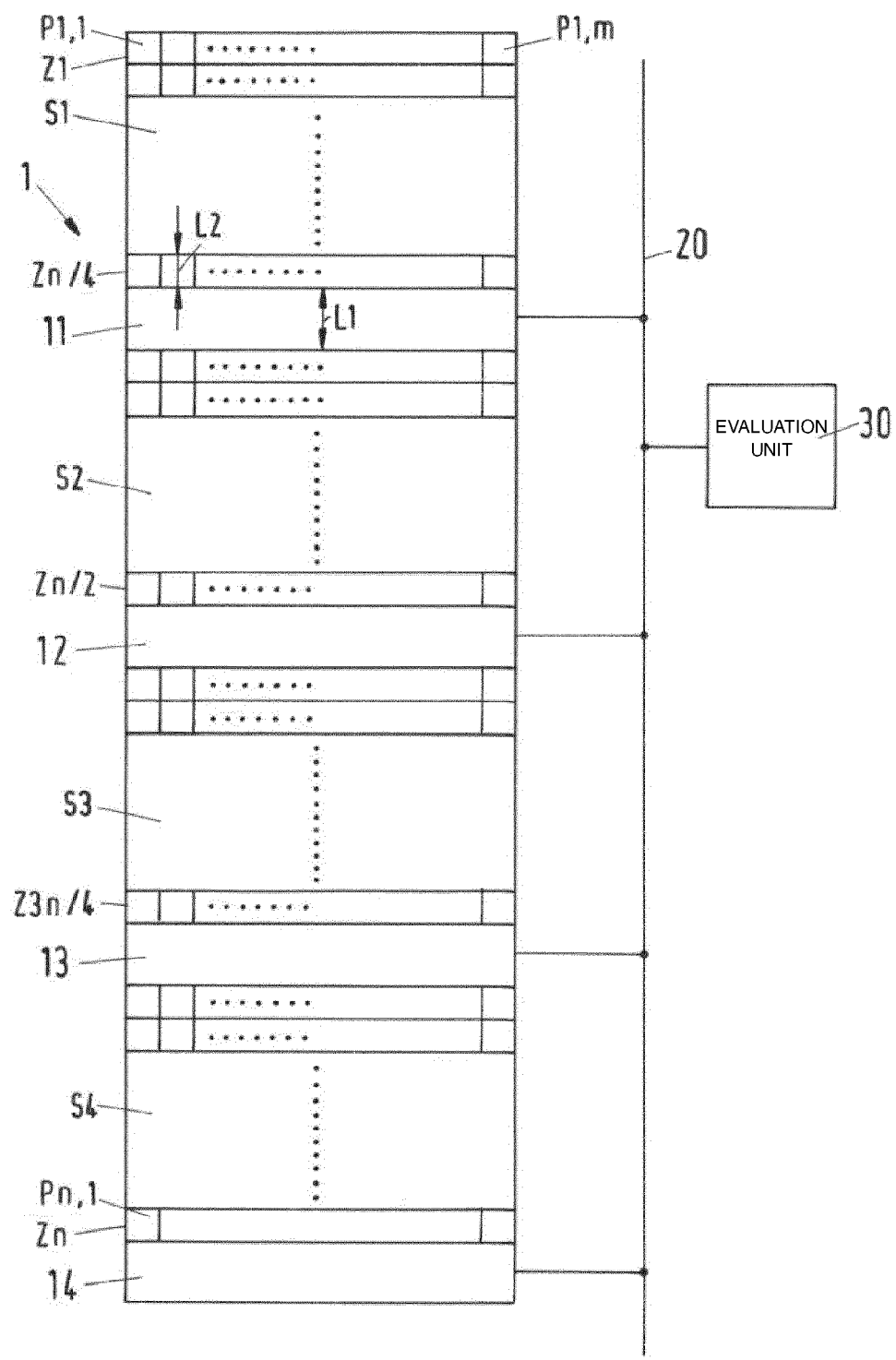
FIG. 1 shows a TDI line detector in a first embodiment.

FIG. 1 schematically depicts a TDI line detector 1, which has a total of n lines Z with m pixels P. In this case, for example, P1,1 is the first pixel P of the first line, Z1 is the first line, and Zn is the nth line. The TDI line detector 1 in the example shown is divided into four submodules S1-S4, which each have n/4 lines Z. The size of all of the pixels P is the same in all of the lines Z in all of the submodules S1-S4. The respective last line Z of a submodule S1-S4 is associated with a set of readout electronics 11-14 associated with the submodule S1-S4. The readout electronics 11-14 are embodied for example as shift registers and are connected via at least one bus system 20 to an evaluation unit 30. In this case, it is also possible for each set of readout electronics 11-14 to be connected via a separate bus system to the evaluation unit 30 or alternatively to a mass storage device.

The length L1 of the readout electronics 11-14 in this case is an integral multiple of the length L2 of the pixels P. The associated pixels P are positioned relative to one another with pixel-level accuracy. The lines Z1-Zn and the readout electronics 11-14 are then synchronously clocked. This division into submodules S1-S4 reduces by a factor of 4 the time during which the position of the TDI line detector 1 has to be stable (e.g. deviation in the spatial position of less than ⅓ of a pixel). This can then also be used, for example, to increase the number n of lines since the stability requirements can be easily met by means of a correspondingly high number of submodules.

Figure 2:
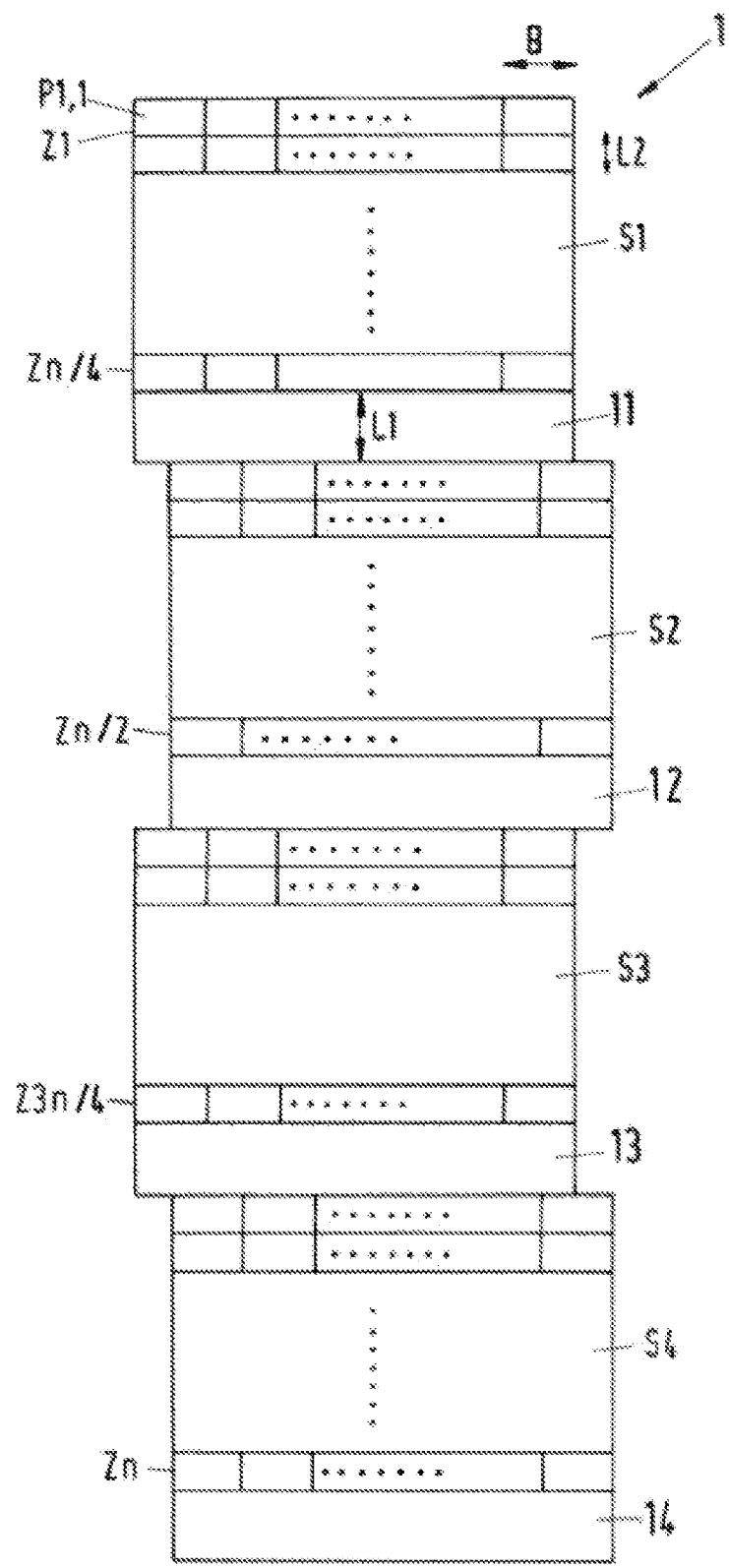
FIG. 2 shows a TDI line detector in a second embodiment.

FIG. 2 shows an alternative embodiment of a TDI line detector 1; elements that are the same have been provided with the same reference numerals. The differences from the embodiment according to FIG. 1 are the shape of the pixels P and the positioning of the submodules S1-S4. The pixels P have a rectangular shape, with the width B being twice the length L2 of the pixels P. In addition, the submodules S1-S4 are alternatingly offset laterally by a half-pixel P. In other words, in the example shown, the second submodule S2 and the fourth submodule S4 are each positioned offset to the right by one-half a pixel width B. This achieves the fact that the effective pixel area is increased, which improves the signal-to-noise ratio. By means of the postprocessing—in which the data of the different submodules S1-S4 are correlated—the staggered positioning then makes it possible for the geometrical resolution, which is reduced due to the increased pixel areas, to then be compensated for once again.

This is of interest particularly for multispectral recordings since they usually use larger pixel areas.

The invention claimed is:

1. A TDI line detector (1) comprising n TDI lines (Z1-Zn), each TDI line (Z) having m pixels (P), and at least one set of readout electronics (11-14), characterized in that the TDI line detector (1) is divided into x submodules (S1-S4), the number of lines (Z) of a submodule (S1-S4) being n/x, the last line of each submodule (S1-S4) being associated with a separate set of readout electronics (11-14), the length (L1) of the readout electronics (11-14) corresponding to an integral multiple of the length (L2) of a pixel (P), where x≥2, and the submodules (S1-S4) or groups of submodules (S1-S4) are alternatingly positioned laterally offset by a half-pixel (P); characterized in that the pixels (P) are rectangular, the pixels (P) being twice as wide as they are long; and wherein said associated pixels of said number of lines (Z) of said x submodules are activated synchronously, wherein said TDI lines (Z1-Zn) are synchronously clocked with the readout electronics (11-14).

2. The TDI line detector according to claim 1, characterized in that 10≤x≤100.

3. The TDI line detector according to claim 2, characterized in that at least some of the submodules (S1-S4) have filters for various spectral ranges.

4. The TDI line detector according to claim 3, characterized in that the pixel size is the same for all lines.

5. The TDI line detector according to claim 2, characterized in that the pixel size is the same for all lines.

6. The TDI line detector according to claim 1, characterized in that at least some of the submodules (S1-S4) have filters for various spectral ranges.

7. The TDI line detector according to claim 6, characterized in that the pixel size is the same for all lines.

8. The TDI line detector according to claim 1, characterized in that the pixel size is the same for all lines.

* * * * *